United States Patent [19]

Aoyama et al.

[11] Patent Number: 5,693,599
[45] Date of Patent: Dec. 2, 1997

[54] FLUX WASHING AGENT

[75] Inventors: Tetsuo Aoyama; Toshio Kondoh, both of Niigata; Toshihiko Kobayashi; Kaoru Tsuyuki, both of Tokorozawa, all of Japan

[73] Assignee: Mitsubishi Gas Chemical Company, Inc., Tokyo, Japan

[21] Appl. No.: 625,835

[22] Filed: Apr. 1, 1996

Related U.S. Application Data

[63] Continuation-in-part of Ser. No. 335,040, Nov. 7, 1994, abandoned.

[30] Foreign Application Priority Data

Dec. 16, 1993 [JP] Japan ................................. 5-316766

[51] Int. Cl.$^6$ ..................................................... C11D 1/62
[52] U.S. Cl. ........................... 510/175; 510/433; 510/504; 510/505
[58] Field of Search ................................. 510/175, 433, 510/504, 505

[56] References Cited

U.S. PATENT DOCUMENTS 4,873,122  10/1989  Darken ............................ 427/97
5,175,078  12/1992  Aoyama et al. ................ 430/331

FOREIGN PATENT DOCUMENTS 1-104924  1/1989  Japan .
3-20489   1/1991  Japan .
4-210236  7/1992  Japan .

*Primary Examiner*—Paul Lieberman
*Assistant Examiner*—John R. Hardee
*Attorney, Agent, or Firm*—Frishauf, Holtz, Goodman, Langer & Chick, P.C.

[57] ABSTRACT

A flux washing agent which comprises an aqueous solution containing a quaternary ammonium salt and hydrazine is disclosed. The flux washing agent is used in the production of printed circuit boards and the like. The flux washing agent has a washing ability, and a property to suppress etching of solder which are comparable with those of Flon 113 and trichloroethylene heretofore used as flux washing agents. Furthermore, the flux washing agent is safe, does not cause environmental pollution and has an excellent rinsing property.

3 Claims, No Drawings

FLUX WASHING AGENT

CROSS-REFERENCE TO RELATED APPLICATION

This application is a continuation-in-part applicaton of application Ser. No. 08/335,040 filed Nov. 7, 1994, now abandoned.

BACKGROUND OF THE INVENTION

1. Field of the Invention

The present invention relates to a novel flux washing agent used in the production of printed circuit boards and the like. More particularly, the present invention relates to a flux washing agent having the property to suppress etching of solder on printed circuit boards.

2. Description of the Related Arts

Generally in conventional production processes of printed circuits and printed circuit boards, flux is coated on a printed circuit or a printed circuit board for the purpose of fixing solder firmly to the board. The flux is generally removed by washing with a flux washing agent after the soldering is finished because, when the flux is left remaining on the printed circuit or the board, the residual flux causes a decrease in electric resistance of the board and the breaking of the circuit by corrosion.

As the flux washing agent, chlorofluorohydrocarbon solvents, such as 1,1,2-trichloro-1,2,2-trifluoroethane (Flon 113), trichloroethylene, 1,1,1-trichloroethane and the like, have heretofore been widely used because of the excellent washing ability and the absence of inflammability. However, the chlorofluorohydrocarbon solvents cause social and environmental problems, such as ozonosphere destruction, underground water pollution, and air pollution, and total prohibition of use and production of these materials are in progress.

As flux washing agents other than the chlorofluorohydrocarbons, various kinds of flux washing agents, such as alcohols, glycols, glycol ethers, hydrocarbons including terpenes, and agents containing these solvents and surfactants, have been proposed. However, the proposed solvents are dangerous because of inflammability and are not preferable for maintaining working safety.

As safe flux washing agents using aqueous systems, inorganic alkaline washing agents are widely used. However, the alkaline washing agents have drawbacks in that the washing ability is inferior to the chlorofluorohydrocarbons and that reliability of the printed circuits and printed circuit boards are decreased because the inorganic alkaline washing agents have a greater tendency to remain on the boards and the circuits. The inorganic alkaline washing agents have also another drawback in that etching of solder components such as lead and tin by the agents occurs vigorously and various kinds of trouble are caused.

JP 01-14924 (Mitsubishi) concerns a semiconductor surface cleaning composition containing 0.01 to 30 weight % quaternary ammonium hydroxide, 0.01 to 30 weight % hydrazine and 0.01 to 5 weight % nonionic surfactant. The nonionic surfactant results in a difficulty in that the nonionic surfactant causes a decrease in the solubility of rosin flux.

As described above, no solder flux washing agents have heretofore been known which are superior to the chlorfluorohydrocarbons in view of the washing ability and the safety. In other words, no solder flux washing agent which can replace chlorofluorohydrocarbon has heretofore been found.

SUMMARY OF THE INVENTION

An object of the present invention is to provide a high performance solder flux washing agent having a washing ability which is comparable with those of Flon 113 and trichloroethylene, but which are safe and do not cause environmental pollution and exhibiting an excellent rinsing property.

As the result of extensive studies by the present inventors to develop a flux washing agent which can replace Flon 113 and trichloroethylene, it was discovered that an alkaline aqueous solution containing a quaternary ammonium salt and hydrazinc has an excellent washing property and provides a safe washing agent. The present invention has been completed on the basis of the discovery.

Thus, the present invention provides a flux washing agent which comprises an aqueous solution containing a quaternary ammonium salt represented by the general formula $[(R^1)_3N\text{-}R)]^+.X^-$ wherein R indicates an alkyl group having 1 to 4 carbon atoms or a hydroxy-substituted alkyl group having 1 to 4 carbon atoms, $R^1$ indicates an alkyl group having 1 to 4 carbon atoms, and X indicates OH group, $HCO_3$ group or $CO_3$ group, and hydrazinc.

Other and further objects, features and advantages of the invention will appear more fully from the following description.

DESCRIPTION OF PREFERRED EMBODIMENTS

The quaternary ammonium salt in the present invention is represented by the general formula $[(R^1)_3N\text{-}R)]^+.X^-$, wherein R indicates an alkyl group having 1 to 4 carbon atoms or a hydroxy-substituted alkyl group having 1 to 4 carbon atoms, $R^1$ indicates an alkyl group having 1 to 4 carbon atoms, and X indicates OH group, $HCO_3$ group or $CO_3$ group. Examples of the quaternary ammonium salts include tetramethylammonium hydroxide, tetraethylammonium hydroxide, tetrapropylammonium hydroxide, tetrabutylammonium hydroxide, trimethyl-2-hydroxyethylammonium hydroxide, triethyl-2-hydroxyethyl-ammonium hydroxide, tripropyl-2-hydroxyethylammonium hydroxide, tributyl-2-hydroxyethylammonium hydroxide, tetramethylammonium carbonate, tetraethylammonium carbonate, tetrapropylammonium carbonate, tetrabutylammonium carbonate, trimethyl-2-hydroxyethylammonium carbonate, triethyl-2-hydroxyethylammonium carbonate, tripropyl-2-hydroxyethylammonium carbonate, tributyl-2-hydroxyethylammonium carbonate, tetramethylammonium hydrogen carbonate, tetraethylammonium hydrogen carbonate, tetrapropylammonium hydrogen carbonate, tetrabutylammonium hydrogen carbonate, trimethyl-2-hydroxyethylammonium hydrogen carbonate, triethyl-2-hydroxyethylammonium hydrogen carbonate, tripropyl-2-hydroxyethylammonium hydrogen carbonate, and tributyl-2-hydroxyethylammonium hydrogen carbonate. The quaternary ammonium salt may be used singly or as a combination of two or more kinds.

In the flux washing agent of the present invention, concentration of the quaternary ammonium salt described above is not particularly limited, but is generally 0.01 to 30% by weight, preferably 0.1 to 10% by weight. Concentration of hydrazine is 0.5 to 15% by weight, preferably 1 to 10% by weight. When the concentration of the quaternary ammonium salt or hydrazine is lower than the specified range for the respective compound, sufficient washing ability cannot be obtained. When the concentration of the quaternary ammonium salt or hydrazine is higher than the specified range for the respective compound, almost no increase in the washing ability is found and the concentration is economically disadvantageous. Thus, concentrations of these compounds out of the specified ranges are not preferable.

In the present invention, the quaternary ammonium salt and hydrazine can be used in various combinations as desired depending on the material and the form of the article for washing and the kind of the flux. However, the washing ability is significantly decreased when either one of the indispensable components which are the quaternary ammonium salt and hydrazine is absent. In other words, the practical flux washing agent showing safety to the environment and having excellent washing ability and rinsing property can be obtained only by the combination of the two indispensable components.

The flux washing agent of the present invention is used at a temperature in the range of ordinary temperature to 90° C. The temperature can be selected suitably depending on the material and the form of the article for washing and the kind of the flux.

The flux washing agent of the present inention does not contain surfactants.

The flux washing agent of the present invention can be used as a washing agent for dogreusing instruments and electronic parts as well as a flux washing agent.

To summarize the advantages obtained by the invention, the flux washing agent of the present invention has excellent washing ability, is highly safe, and exhibits property to sufficiently suppress dissolution of solder. The flux washing agent of the present invention also has an excellent rinsing property because it is an aqueous solution. Therefore, the flux washing agent has the excellent properties practically to replace chlorofluorohydrocarbon solvents, such as Flon 113 and trichloroethylene.

The invention will be understood more readily with reference to the fallowing examples; however, these examples are intended to illustrate the invention and are not to be construed to limit the scope of the invention.

EXAMPLE 1 to 9 and Comparative Examples 1 to 5

On the whole surface of a printed circuit board (a copper-plated laminate board), a rosin flux (a product of Sanwa Kagaku Co., Ltd.; a trade name, SF-270) was coated and dried at 140° C. for 2 minutes. The board was treated with a solder flow at 250° C. for 5 seconds to prepare a sample board. The sample board was treated for testing with various kinds of washing agent having various compositions at various washing temperatures for various washing times and evaluated on the washing ability.

For the test, the sample board was dipped into a washing solution. Degree of removal of the flux was visually observed and the washing ability was evaluated according to the following criterion:

◎ The flux is removed completely.

○ Most of the flux is removed.

Δ Some amount of the flux is remaining.

X A considerable amount of the flux is remaining.

Results of the evaluation is shown in Table 1.

TABLE 1

| | quaternary ammonium salt | | concentration of hydrazine % by wt. | washing temperature °C. | washing time minute | evaluation |
|---|---|---|---|---|---|---|
| | kind | concentration % by wt. | | | | |
| Example 1 | tetramethylammonium hydroxide | 0.7 | 3.0 | 60 | 5 | ◎ |
| Example 2 | the same as Example 1 | 3.7 | 3.0 | 60 | 5 | ◎ |
| Example 3 | the same as Example 1 | 1.5 | 3.0 | 40 | 10 | ◎ |
| Example 4 | the same as Example 1 | 3.7 | 1.0 | 60 | 5 | ○ |
| Example 5 | trimethyl-2-hydroxy-ethylammonium hydroxide | 1.0 | 5.0 | 70 | 5 | ◎ |
| Example 6 | the same as Example 5 | 4.0 | 0.5 | 60 | 5 | ◎ |
| Example 7 | tetraethylammonium hydroxide | 5.0 | 1.5 | 50 | 5 | ○ |
| Example 8 | tetramethylammonium carbonate | 8.0 | 2.0 | 70 | 10 | ○ |
| Example 9 | tetramethylammonium hydroxide tetramethylammonium hydrogen carbonate | 4.0 1.0 | 3.0 | 60 | 5 | ◎ |
| Comparative Example 1 | tetramethylammonium hydroxide | 3.7 | — | 60 | 5 | Δ |
| Comparative Example 2 | tetramethylammonium hydroxide | 0.7 | — | 60 | 5 | x |
| Comparative Example 3 | tetramethylammonium carbonate | 8.0 | — | 70 | 10 | x~Δ |
| Comparative Example 4 | tetramethylammonium hydroxide | 0.7 | — | 80 | 5 | Δ |
| Comparative Example 5 | none | — | 5.0 | 60 | 5 | x |

EXAMPLES 10 to 12 and Comparative Examples 6 to 8

Etching rates of lead and tin at 60° C. were measured with a printed circuit board prepared by using a conventional solder (lead/tin: 6/4). Results are shown in Table 2.

TABLE 2

|  | quaternary ammonium salt | | concentration of hydrazine % by wt. | etching rate of lead Å/min. | etching rate of tin Å/min. |
| --- | --- | --- | --- | --- | --- |
|  | kind | concentration % by wt. | | | |
| Example 10 | tetramethylammonium hydroxide | 3.7 | 3.0 | 5 | 10 |
| Example 11 | trimethyl-2-hydroxyethylammonium hydroxide | 1.0 | 5.0 | 1 or less | 5 |
| Example 12 | tetramethylammonium carbonate | 8.0 | 2.0 | 1 or less | 5 |
| Comparative Example 6 | tetraethylammonium hydroxide | 3.7 | — | 100 | 950 |
| Comparative Example 7 | trimethyl-2-hydroxyethylammonium hydroxide | 1.0 | — | 65 | 700 |
| Comparative Example 8 | tetramethylammonium carbonate | 8.0 | — | 35 | 300 |

EXAMPLE 13

A sample board prepared as in the Examples hereinabove was dipped in a washing agent consisting of 0.7% by weight of tetramethylammonium hydroxide (TMAH) and 3.0% by weight of hydrazine, at a temperature of 60° C. for 5 minutes, and the amount of the dissolved rosin flux was determined. The result is shown in Table 3.

Comparative Examples 9 to 12

The sample board (prepared as described in the Example 13 hereinabove) was dipped in a washing agent consisting of 0.7% by weight of tetramethylammonium hydroxide (TMAH), 3.0% by weight of hydrazine, and a prescribed amount of nonionic surfactant (EP-130A™ produced by Dai-ichi Kogyo Seiyaku Co., Ltd. of Japan) at a temperature of 60° C for 5 minutes, and the amount of the dissolved rosin flux was determined. The results are shown in Table 3.

TABLE 3

|  | concentration (% by weight) | | | amount of rosin flux dissolved (mg/ml) |
| --- | --- | --- | --- | --- |
|  | TMAH | hydrazine | nonionic surfactant | |
| Example 13 | 0.7 | 3.0 | — | 3.4 |
| Comparative Example 9 | 0.7 | 3.0 | 0.02 | 3.1 |
| Comparative Example 10 | 0.7 | 3.0 | 0.2 | 2.8 |
| Comparative Example 11 | 0.7 | 3.0 | 0.6 | 2.8 |
| Comparative Example 12 | 0.7 | 3.0 | 1.2 | 2.8 |

As Table 3 shows, when a nonionic surfactant is added to the washing agent of the present invention, the solubility of the rosin flux becomes substantially lowered, which is contrary to the object of the present invention.

As clearly shown in the examples, the flux washing agent of the present invention has an excellent washing ability and shows very small etching rates of lead and tin.

What is claimed is:

1. A flux washing agent which consists essentially of (i) at least one quaternary ammonium salt represented by the formula $((R^1)_3N-R^+ \cdot X^-$, wherein R is an unsubstituted alkyl group having 1 to 4 carbon atoms or a hydroxy-substituted alkyl group having 1 to 4 carbon atoms, $R^1$ is a methyl group, an ethyl group, a propyl group or a butyl group, and X is an OH group, a $HCO_3$ group or a $CO_3$ group, and (ii) hydrazine, in an aqueous solution, wherein said quaternary ammonium salt is in a concentration of 0.1 to 10% by weight, and said hydrazine is in a concentration of 1 to 10% by weight, said agent contains no surfactant.

2. The flux washing agent according to claim 1, wherein R is a 2-hydroxyethyl group.

3. The flux washing agent according to claim 2, wherein the quaternary ammonium salt is selected from the group consisting of tetrapropylammonium hydroxide, tetrabutylammonium hydroxide, tetrapropylammonium hydroxide, tetrabutylammonium hydroxide, trimethyl-2-hydroxyethylammonium hydroxide, triethyl-2-hydroxyethylammonium hydroxide, tripropyl-2-hydroxyethylammonium hydroxide, tributyl-2-hydroxyethylammonium hydroxide, tetramethylammonium carbonate, tetraethylammonium carbonate, tetrapropylammonium carbonate, tetrabutlammonium carbonate, trimethyl-2-hydroxyethlamonium carbonate, triethyl-2-hydroxyethylammonium carbonate, tripropyl-2-hydroxyethylammonium carbonate, tributyl-2-hydroxyethylammonium carbonate, tetramethylammonium hydrogen carbonate, tetraethylammonium hydrogen carbonate, tetrapropylammonium hydrogen carbonate, tetrabutylammonium hydrogen carbonate, trimethyl-2-hydroxyethlammonium hydrogen carbonate, triethyl-2-hydroxyethylammonium hydrogen carbonate, tripropyl-2-hydroxyethylammonium hydrogen carbonate, and tributyl-2-hydroxyethylammonium hydrogen carbonate.

* * * * *